(12) United States Patent
Zhao et al.

(10) Patent No.: US 7,333,333 B2
(45) Date of Patent: Feb. 19, 2008

(54) LOCKING DEVICE FOR HEAT SINK

(75) Inventors: Liang-Hui Zhao, Guangdong (CN); Yi-Qiang Wu, Guangdong (CN)

(73) Assignees: Fu Zhun Precision Industry (Shen Zhen) Co., Ltd., Bao'an District, Shenzhen, Guangdong Province; Foxconn Technology Co., Ltd., Tu-Cheng, Taipei Hsien (TW)

( * ) Notice: Subject to any disclaimer, the term of this patent is extended or adjusted under 35 U.S.C. 154(b) by 117 days.

(21) Appl. No.: 11/164,593

(22) Filed: Nov. 30, 2005

(65) Prior Publication Data

US 2007/0121298 A1 May 31, 2007

(51) Int. Cl.
*H05K 7/20* (2006.01)

(52) U.S. Cl. ............ 361/700; 361/687; 361/704; 361/710; 24/457; 24/458; 165/80.3; 165/185; 257/707; 257/714; 257/715; 257/E23.084; 257/E23.086

(58) Field of Classification Search .......... 361/687, 361/700, 704, 710; 24/457, 458; 165/80.3, 165/185; 257/707, 714, 715, E23.084, E23.086
See application file for complete search history.

(56) References Cited

U.S. PATENT DOCUMENTS

| | | | |
|---|---|---|---|
| 5,638,258 A * | 6/1997 | Lin ......................... | 361/704 |
| 6,222,734 B1 | 4/2001 | Bookhardt et al. | |
| 6,418,022 B1 * | 7/2002 | Chen ....................... | 361/704 |
| 6,507,489 B1 * | 1/2003 | McGowan et al. ......... | 361/687 |
| 6,611,999 B1 | 9/2003 | Hsu | |
| 6,778,395 B1 * | 8/2004 | Dong et al. ............... | 361/704 |
| 7,013,537 B2 * | 3/2006 | Lin et al. ................. | 24/457 |
| 7,106,591 B2 * | 9/2006 | Fan et al. ................. | 361/704 |
| 7,167,367 B2 * | 1/2007 | Zhang ...................... | 361/704 |
| 7,292,443 B1 * | 11/2007 | Lai et al. ................. | 361/704 |
| 2005/0066487 A1 * | 3/2005 | Zhang ...................... | 24/457 |
| 2005/0180114 A1 * | 8/2005 | Zhou et al. ............... | 361/704 |
| 2006/0171125 A1 * | 8/2006 | Yu et al. .................. | 361/710 |

FOREIGN PATENT DOCUMENTS

CN 2665797 Y 12/2004

\* cited by examiner

*Primary Examiner*—Jayprakash Gandhi
*Assistant Examiner*—Courtney L Smith
(74) *Attorney, Agent, or Firm*—Winston Hsu

(57) ABSTRACT

A heat dissipation device includes a heat sink, a retention module and a clip. The retention module includes a plurality of locking portions. The clip includes a main piece, an operating piece pivotally connecting with the main piece, and a buckling piece pivotally connecting with the operating piece. The main piece includes a pressing beam resting on the heat sink and a clamping portion engaging with a corresponding locking portion of the retention module. By operating the operating piece, the heat dissipation device has two positions, at a first of which a clamping portion of the buckling piece engages with a corresponding locking portion of the retention module and the pressing beam of the main piece presses the heat sink toward the retention module; at a second of the two positions, the clamping portion of the buckling piece disengages from the retention module.

19 Claims, 5 Drawing Sheets

LOCKING DEVICE FOR HEAT SINK

FIELD OF THE INVENTION

The present invention relates generally to a locking device for a heat sink, and more particularly to a locking device for securing the heat sink to a heat-generating electronic device.

DESCRIPTION OF RELATED ART

With advancement of computer technology, electronic devices operate rapidly. It is well known that the more rapidly the electronic devices operate, the more heat they generate. If the heat is not dissipated duly, the stability of the operation of the electronic devices will be impacted severely. Generally, in order to ensure the electronic device to run normally, a heat sink is used to dissipate the heat generated by the electronic device. In order to keep the heat sink to intimately contact with the electronic device, a locking device is usually desired to secure the heat sink to the electronic device.

Nowadays, numerous locking devices are used to secure heat sinks to the electronic devices. Typically, a locking device comprising a plurality of fasteners such as screws is widely used. Generally, the heat sink comprises a base and a plurality of fins extending from the base. Usually, the base of the heat sink has a portion without the fins thereby to accommodate the screws therein. A plurality of through holes is defined in such a portion of the base, and the screws are inserted through the holes of the base and a printed circuit board to engage with locking members attached to a backside of the printed circuit board. Therefore, the heat sink is secured to the printed circuit board and thermally contacts with the heat-generating electronic device. However, in order to position the screws on the heat sink, the base of the heat sink needs a portion thereof without the provision of the fins thereon, which reduces heat dissipating area of the heat sink. Additionally, when it comes to operate the screws to assemble the heat sink to the printed circuit board, the fins on the base hinder the screws from being easily and smoothly screwed.

What is needed, therefore, is a locking device for secure a heat sink to a heat generating device conveniently.

SUMMARY OF INVENTION

A heat dissipation device comprises a heat sink, a retention module receiving the heat sink, a clip for securing the heat sink toward the retention module. The heat sink has a bottom face for contacting with a heat generating device and a top face opposite to the bottom face. The retention module comprises a bottom receiving the bottom face of the heat sink therein and a plurality of locking portions extending from the bottom. The clip comprises a main piece, an operating piece pivotally connecting with the main piece, and a buckling piece pivotally connecting with the operating piece. The main piece comprises a pressing beam resting on the top face of the heat sink, and a connecting portion and a clamping portion respectively depending from two ends of the pressing beam. The clamping portion engages with a corresponding locking portion of the retention module. The operating piece comprises a first pivoting portion pivotally connecting with the connecting portion of the main piece, and a second pivoting portion above the first pivoting portion. The buckling piece comprises a pivoting portion connecting with the second pivoting portion of the operating piece, and a clamping portion for engaging with the retention module. By operating the operating piece, the heat dissipation device has two positions, at a first of which the clamping portion of the buckling piece of the clip engages with a corresponding locking portion the retention module and the pressing beam of the main piece of the clip presses the heat sink toward the retention module, at a second of which the clamping portion of the buckling piece of the clip disengages from the retention module.

Other advantages and novel features will become more apparent from the following detailed description of preferred embodiments when taken in conjunction with the accompanying drawings, in which:

DETAILED DESCRIPTION

Figure 1:
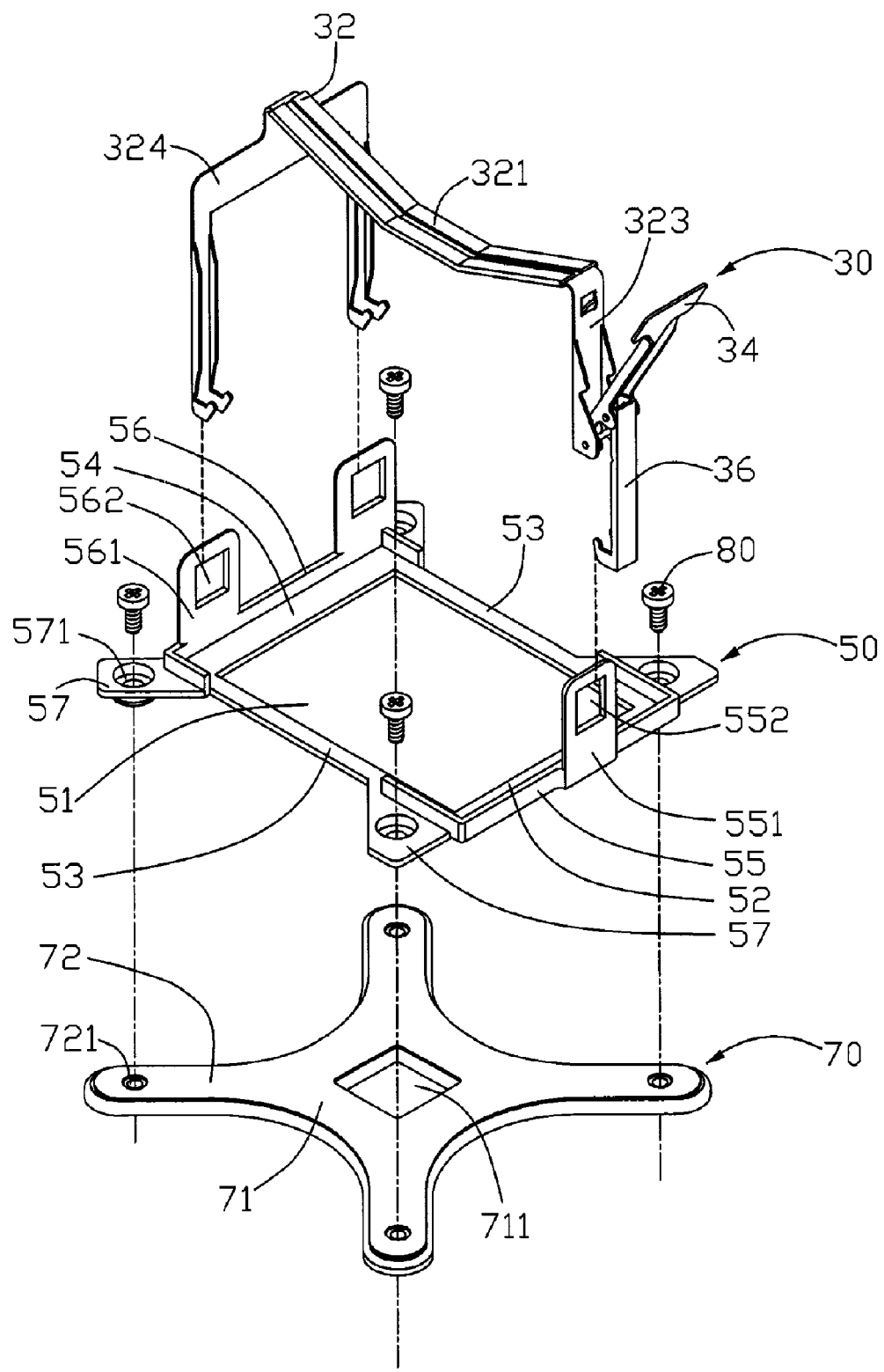
FIG. 1 is an exploded, isometric view of a locking device in accordance with a preferred embodiment of the present invention.

Referring to FIG. 1, a locking device in accordance with a preferred embodiment of the present invention is used for securing a heat sink (not shown) to a heat generating electronic device (not shown). The locking device comprises a clip 30, a retention module 50 and a back plate 70.

Figure 2:
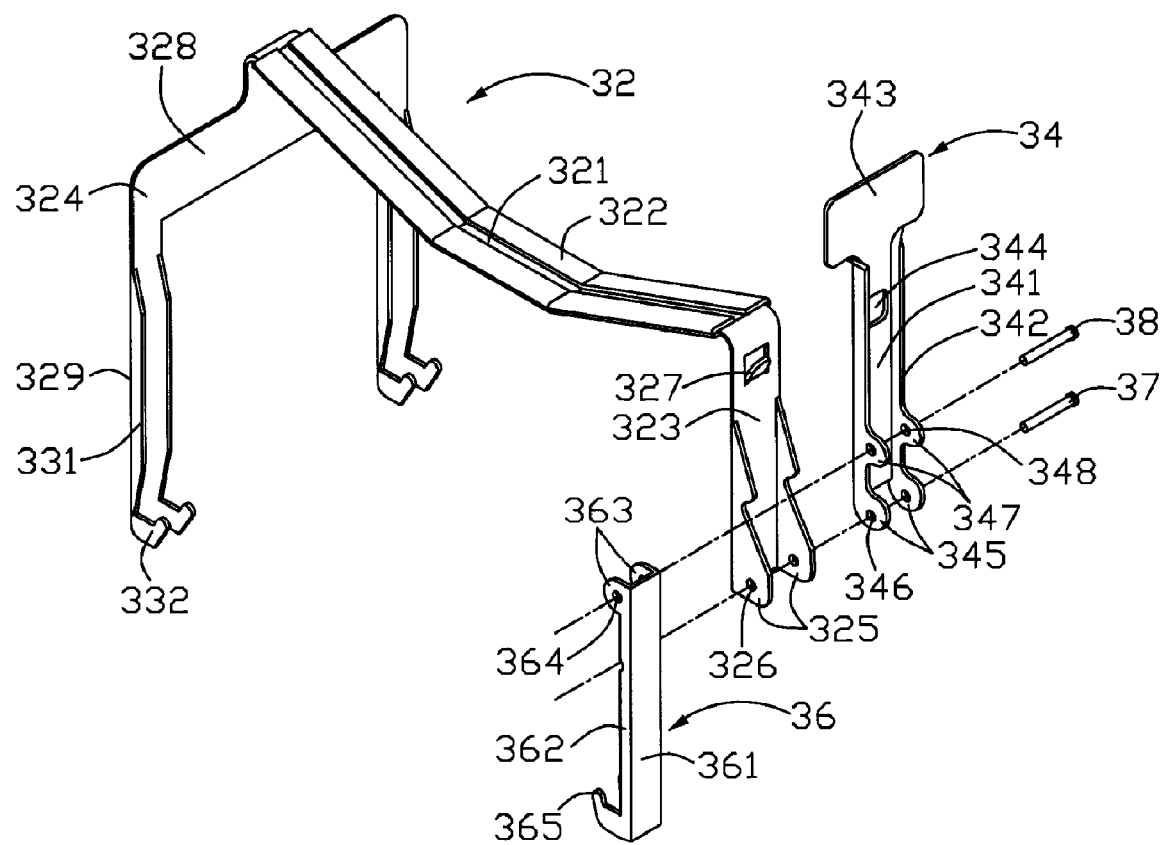
FIG. 2 shows a clip of the locking device of FIG. 1.

Referring also to FIG. 2, the clip 30 has a substantially M-shaped profile, and comprises a main piece 32, an operating piece 34 and a buckling piece 36.

The main piece 32 is formed by stamping and folding a metal strap. The main piece 32 comprises a substantially V-shaped pressing beam 321. Two reinforce ribs 322 extend from two sides of the pressing beam 321 and overlap on the pressing beam 321. A connecting portion 323 and a clamping portion 324 respectively extend downwards from two ends of the pressing beam 321. A pair of pivoting portions 325 extends from two opposite sides of a lower end of the connecting portion 323. The two pivoting portions 325 respectively define two pivot holes 326 which are aligned with each other. Above the pivoting portions 325, a finger 327 extends outwardly and upwardly from the connecting portion 323. The clamping portion 324 comprises a crossband 328 and two clamping legs 329 perpendicularly depending from two ends of the crossband 328 respectively. Each clamping leg 329 has two ribs 331 perpendicularly extending from two opposite sides thereof. The two ribs 331 form two clasps 332 at a lower end of each clamping leg 329.

The operating piece 34 has a main strip 341 and two flanges 342 substantially perpendicularly extending from two opposite edges of the main strip 341, and an expanded operating plate 343 extending above the flanges 342 from the main strip 341. An engaging hole 344 corresponding to the finger 327 of the main piece 32 is defined in the main strip 341. A pair of opposite first pivoting tabs 345 each having a first pivoting hole 346 defined therein extends from a lower end of the flanges 342 respectively. Above the first pivoting tabs 345, a pair of opposite second tabs 347 each having a second pivoting hole 348 defined therein extends from the flanges 342 respectively.

The buckling piece 36 comprises a main body 361 and two flanges 362 perpendicularly extending from the main body 361. At an upper end of the buckling piece 36, a pair of pivoting tabs 363 with pivoting holes 364 defined therein respectively extends from the flanges 362. Similar to the clamping legs 329 of the main piece 32, the buckling piece 36 has two clasps 365 formed at a lower end thereof.

In assembly of the clip 30, the operating piece 34 is pivotally connected to the connecting portion 323 of the main piece 32 by fitting a first pivot post 37 in the pivoting holes 326 of the pivoting portions 325 of the main piece 32 and the first pivoting holes 346 of the pivoting tabs 345 of the operating piece 34. The buckling piece 36 is pivotably connected to the operating piece 34 by fitting a second pivot post 38 in the second pivot holes 348 of the second pivoting tabs 347 of the operating piece 34 and the pivot holes 364 of the pivoting tabs 363 of the buckling piece 36. The clamping legs 324 of the main piece 32 and the buckling piece 36 of clip 30 define a triangle in the horizontal.

The retention module 50 is a substantially rectangular frame, and has an opening 51 defined in a center thereof and four interconnecting beams 52, 53, 54 around the opening 51. A first sidewall 55 extends upwardly from an outmost edge of a first beam 52 of the four beams. A first locking ear 551 with a locking hole 552 defined therein extends upwardly from a center of the first sidewall 55. Opposite to the first sidewall 55, a second sidewall 56 extends from a third beam 54 of the four beams. From the second sidewall 56, two second locking ears 561 each similar to the first locking ear 551 extend upwardly adjacent front and rear ends of the second sidewall 56. Each second locking ear 561 has a locking hole 562 defined therein. The first and second sidewalls 55, 56 respectively have two end portions (not labeled) extending to two opposite second beams 53 of the four beams. Four fixing feet 57 each having a fixing hole 571 defined therein respectively extend from outer sides of the end portions of the first and second sidewalls 55, 56, near four corners of the retention module 50.

The back plate 70 is generally cross-shaped in profile, and comprises a substantially rectangular central portion 71 with an opening 711 defined in a center thereof. Four fixing arms 72 extend from diagonal corners of the central portion 71. Each of the fixing arms 72 defines a fixing hole 721 at a distal end thereof for fixing the back plate 70 to the printed circuit board.

Figure 3:
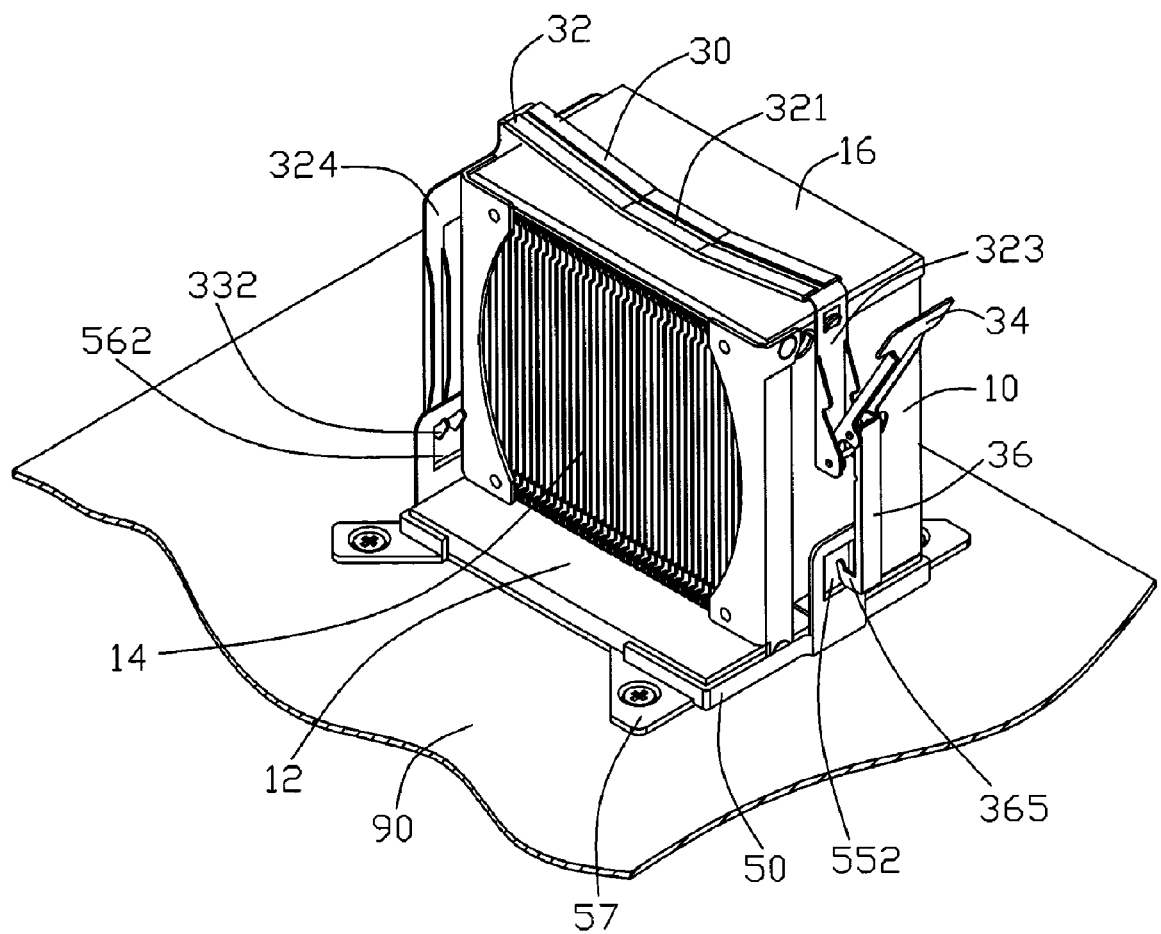
FIG. 3 is a assembled view of FIG. 1 with a heat sink and a printed circuit board at an unlocked position.

Referring to FIG. 3, the retention module 50 is located on a top face of a printed circuit board 90 and surrounds an electronic device (not shown) on the printed circuit board 90. The back plate 70 is positioned opposite to the retention module 50 on a bottom face of the printed circuit board 90. The retention module 50 and the back plate 70 are assembled together by extending four screws 80 through the fixing holes 571 of the fixing feet 57 of the retention module 50 to screw in the fixing holes 721 of the fixing arms 72 of the back plate 70.

A heat sink 10 is brought to rest on the retention module 50. The heat sink 10 has a base 12 located on the retention module 50. A plurality of fins 14 extends from the base 12 of the heat sink 10. The heat sink 10 further comprises a cover 16 located on the fins 14. The base 12, the fins 14 and the cover 16 are securely connected together by soldering.

Figure 4:
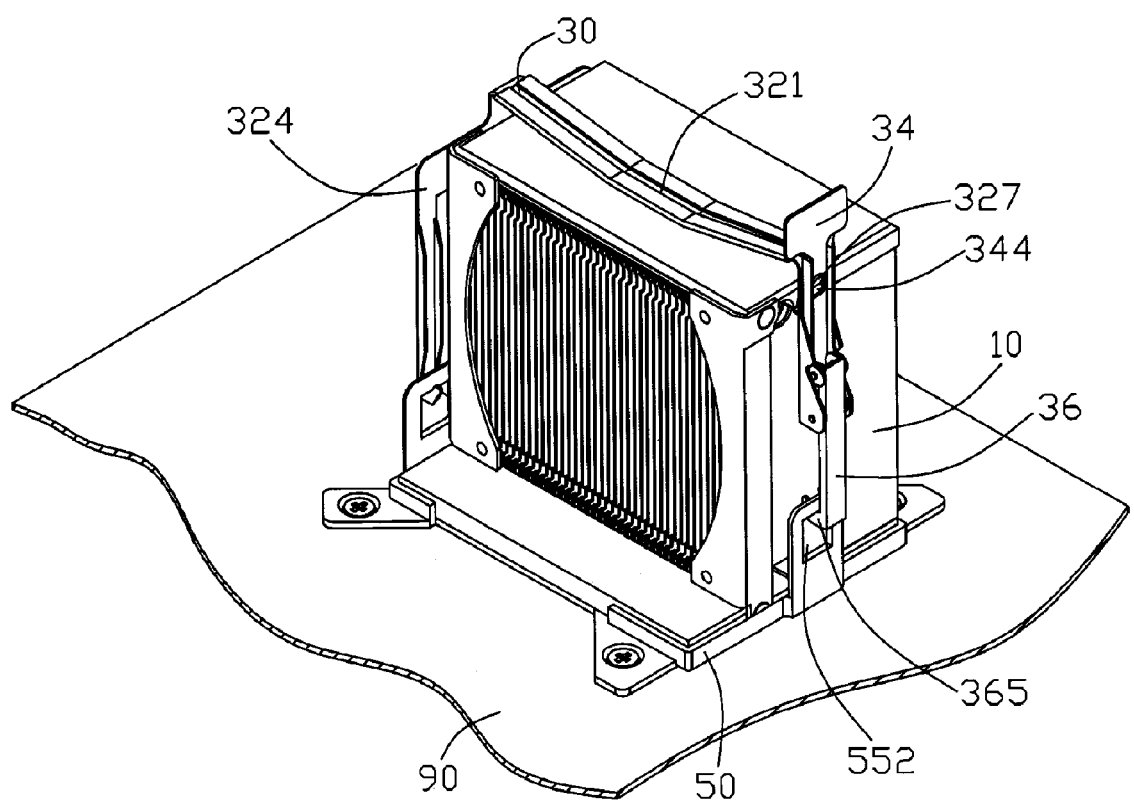
FIG. 4 is a view similar to FIG. 3 but at a locked position.
Figure 5:
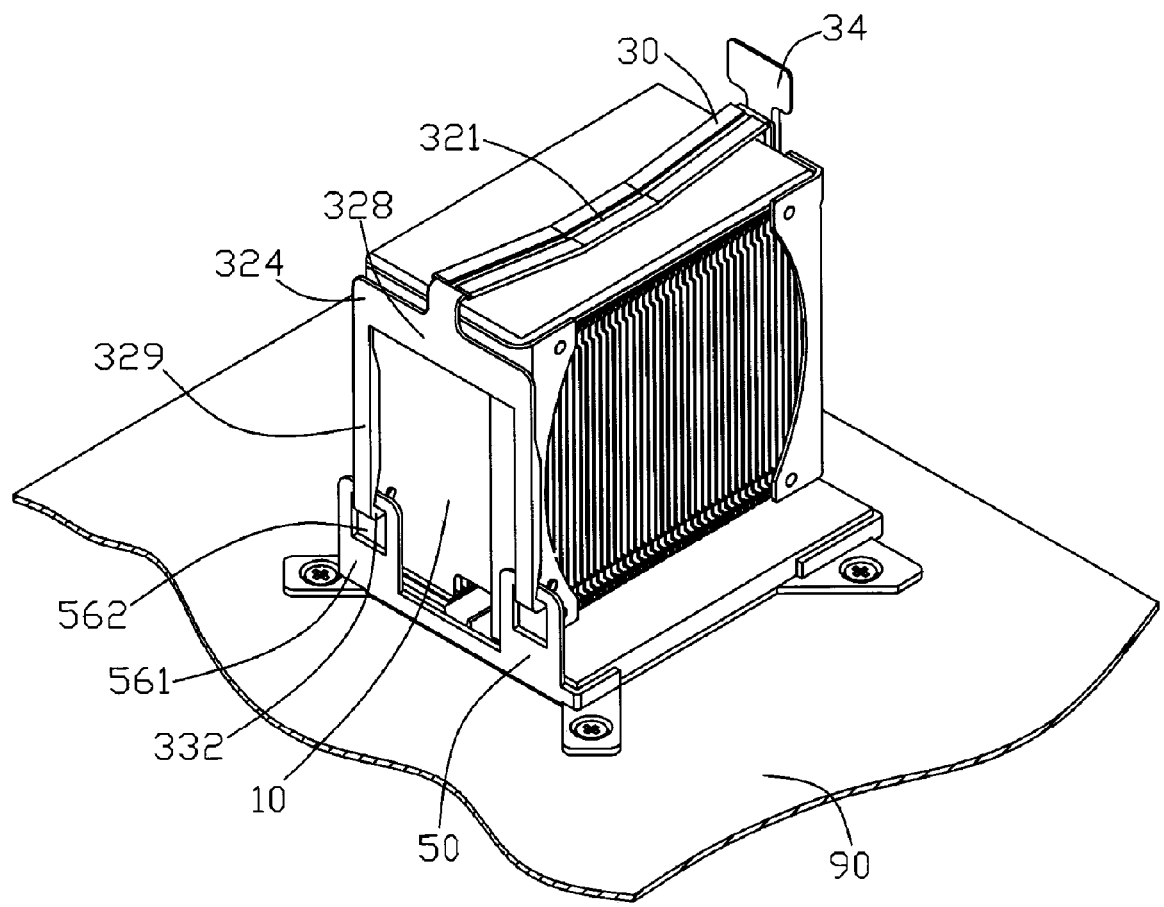
FIG. 5 is an assembled view similar to FIG. 4 but in a different aspect.

Referring to FIGS. 3-5, when it comes to secure the heat sink 10 to the retention module 50 so that the heat sink 10 can have an intimate contact with the electronic device, the clip 30 spans on the heat sink 10 with the pressing beam 321 of the main piece 32 thereof resting on the cover 16 of the heat sink 10. The clamping legs 324 of the main piece 32 and the buckling piece 36 of the clip 30 are respectively located at two opposite sides of the heat sink 10. The clasps 332 of the clamping legs 324 of the main piece 32 clasp the second locking ears 561 of the retention module 50 at a location adjacent tops of the locking holes 562. The clasps 365 of the buckling piece 36 extend in the locking hole 552 of the first locking ear 551 of the retention module 50. Operating the operating plate 343 of the operating piece 34 of the clip 30 to rotate the operating piece 34 upwardly until the finger 327 of the connecting portion 323 of the main piece 32 engages in the engaging hole 344 of the operating piece 34. By this, the buckling piece 36 of the clip 30 is elevated; the clasps 365 of the buckling piece 36 tightly engage with the first locking ear 551 at an upper edge of the locking hole 552 of the retention module 50 upwardly. Therefore, the heat sink 10 is secured to the electronic device.

To remove the heat sink 10 from the electronic device, the operating plate 343 is turned downwardly, whereby the finger 327 of the connecting portion 323 of the main piece 32 disengages from the engaging hole 344 of the operating piece 34. By the downward rotation of the operating piece 34 of the clip 30, the buckling piece 36 falls, and the clasps 365 of the buckling piece 36 disengage from the first locking ear 551 of the retention module 50. Therefore, the heat sink 10 can be detached from the electronic device.

According to the preferred embodiment of the present invention, the operating piece 34 pivotally connects with the main piece 32 and the buckling piece 36. Two clamping legs 324 of the main piece 32 of the clip 30 engage with the retention module 50. While operating the operating piece 34, the buckling piece 36 of the clip 30 is elevated or lowered to engage with or disengage from the retention module 50. The pressing beam 321 of the main piece 32 of the clip 30 presses or is released from pressing the heat sink 10 toward to the electronic device. Consequently, the heat sink 10 is secured to or detached from the electronic device.

Furthermore, when the heat sink 10 is secured to the electronic device, the operating piece 34 is locked to the main piece 32 via the finger 327 of the connecting portion 323 of the main piece 32 engaging within the engaging hole 344 of the operating piece 34; therefore, the operating piece 34 is prevented from rotating downwardly when the locking device according to the present invention and the heat sink 10 are subject to vibration or shock.

Additionally, the clip 30 according to the present invention engages with the retention module 50 at three apexes of a triangle (i.e., the two clamping legs 324 of the main piece 32 and the buckling piece 36); thus, in assembly of the clip 30, the heat sink 10 and the retention module 50, the heat sink 10 can be more firmly secured to retention module 50 and the electronic device by the clip 30.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
a heat sink having a bottom face for contacting with a heat generating device and a top face opposite to the bottom face;
a retention module comprising a bottom receiving the heat sink thereon and a plurality of locking portions extending from the bottom; and a clip spanning on the heat sink, the clip comprising:
a main piece comprising a pressing beam and a connecting portion and a clamping portion respectively depending downwardly from two ends of the pressing beam, the clamping portion engaging with a corresponding locking portion of the retention module, the connecting portion comprising a pivoting portion formed at an end thereof;
an operating piece pivotally connecting with the pivoting portion of the connecting portion of the main piece;
a buckling piece pivotally connecting with the operating piece, the buckling piece comprising a clamping portion for engaging with the retention module;
wherein, by operating the operating piece, the heat dissipation device has two positions, at a first of which the clamping portion of the buckling piece of the clip engages with a corresponding locking portion the retention module, the pressing beam of the main piece of the clip presses the heat sink toward the retention module, at a second of which the clamping portion of the buckling piece of the clip disengages from the retention module; and
wherein the connecting portion of the main piece of the clip has an engaging portion spaced from the pivoting portion thereof, and the operating piece of the clip comprises an engaging portion locking the engaging portion of the connecting portion of the main piece when the heat dissipation device is at the first position.

2. The heat dissipation device of claim 1, wherein the engaging portion of the connecting portion of the main piece of the clip is a finger extending outwardly and upwardly, and wherein the engaging portion of the operating piece is an engaging hole defined in the operating piece.

3. The heat dissipation device of claim 1, wherein the operating piece of the clip comprises a pivoting portion having first and second pivoting tabs, and wherein the main piece and the buckling piece pivotally connect with the operating piece at the second and first pivoting tabs, respectively.

4. The heat dissipation device of claim 3, wherein the first pivoting tabs are located above the second pivoting tabs of the pivoting portion of the operating piece of the clip.

5. The heat dissipation device of claim 1, wherein the clamping portion of the main piece of the clip comprises a crossband and two clamping legs extending from two ends of the crossband, and wherein the two clamping legs engaging with two corresponding locking portions of the retention module.

6. The heat dissipation device of claim 5, wherein each of the two clamping legs of the clamping portion of the main piece of the clip has a clasp at a distal end thereof, and wherein each of the locking portions of the retention module defines a locking hole therein, the clasp engaging within the locking hole.

7. The heat dissipation device of claim 1, wherein the buckling piece of the clip has a clasp at a distal end thereof, and wherein a locking portion of the retention module corresponding to the clasp defines a locking hole therein, the clasp engaging within the locking hole when the heat dissipation device is in the first position.

8. The heat dissipation device of claim 1, wherein the bottom of the retention module extends two opposite sidewalls, and wherein the locking portions of the retention module extend from the sidewalls.

9. The heat dissipation device of claim 8, wherein each of the sidewalls of the retention module has two ends thereof extending to two opposite sides of the bottom, and wherein a fixing foot extends from a bottom of each of the end of the sidewalls.

10. A clip comprising:
a main piece comprising a pressing beam, a connecting portion and a clamping portion respectively extending from two ends of the pressing beam, the connecting portion having an engaging portion, the clamping portion comprising a crossband and two spaced clamping legs respectively depending from two ends of the crossband;
an operating piece pivotably connecting with the connecting portion, the operating piece comprising an operating portion, an engaging portion for engaging with the engaging portion of the connecting portion, a first pivoting portion pivotally connecting with the connecting portion of the main piece, and a second pivoting portion above the first pivoting portion; and
a buckling piece pivotally connecting with the operating piece, the buckling piece comprising a pivoting portion connecting with the second pivoting portion of the operating piece, and a clamping portion similar to the clamping leg of the clamping portion of the main piece;
wherein the engaging portion of the operating piece is distant from the first pivoting portion of the operating piece.

11. The clip of claim 10, wherein the two clamping legs of the clamping portion of the main piece and clamping portion of the buckling piece corporately define a triangle at horizontal.

12. The clip of claim 10, wherein the first pivoting portion of the operating piece define a pair of pivoting holes therein, and wherein the connecting portion of the main piece has a pair of pivoting holes defined therein, a pivoting post being received in the pivoting holes of the first pivoting portion of the operating piece and the connecting portion of main piece.

13. The clip of claim 10, wherein the second pivoting portion defines a pair of pivoting holes therein, and wherein the pivoting portion of the buckling piece has a pair of pivoting holes defined therein, a pivoting post being received in the pivoting holes of the second pivoting portion of the operating piece and the pivoting portion of the buckling piece.

14. The clip of claim 10, wherein the clamping legs of the clamping portion of the main piece have clasps formed at distal ends thereof.

15. The clip of claim 10, wherein the buckling piece has a clasp formed at a distal end thereof.

16. The clip of claim 10, wherein the clip has a general M-shaped profile.

17. The clip of claim 10, wherein the pressing beam is general V-shaped.

18. An locking device for securing a heat sink to an electronic device mounted on a circuit board, comprising:
a back plate attached to a bottom side of the circuit board;
a retention module attached to a top side of the circuit board;
fasteners extending through the circuit board and connecting the retention module and the back plate together; and
a clip having:
a pressing beam adapted for downwardly pressing the heat sink, a first leg and a buckling piece respectively at two opposite ends of the pressing beam and engagable with the retention module, a connecting portion extending from one of the two opposite ends of the pressing beam where the buckling piece is at and an operating piece having pivoting portions pivotably connected with the connecting portion and the buckling piece, wherein the operating piece is rotary between a locking position in which the buckling piece securely engages with the retention module and an unlocking position in which the buckling piece disengages from the retention module;

wherein the operating piece defines a hole and the connecting portion forms a finger, the finger extending into the hole when the operating piece is moved to the locking position, the hole of the operating piece is spaced from the pivoting portions of the operating piece.

19. The heat dissipation device of claim 1, wherein the heat sink comprises a plurality of fins positioned on the top face thereof and a cover located above the fins, and the pressing beam of the main piece is positioned on the cover.

* * * * *